United States Patent
Chan et al.

(10) Patent No.: US 7,924,184 B1
(45) Date of Patent: Apr. 12, 2011

(54) HIGH-SPEED SERIAL INTERFACE CIRCUITRY FOR PROGRAMMABLE INTEGRATED CIRCUIT DEVICES

(75) Inventors: Allen Chan, San Jose, CA (US); Sergey Shumarayev, Los Altos Hills, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 715 days.

(21) Appl. No.: 11/904,008

(22) Filed: Sep. 24, 2007

(51) Int. Cl.
*H03M 9/00* (2006.01)
(52) U.S. Cl. ........................................ 341/100; 341/101
(58) Field of Classification Search ................. 341/100, 341/101; 375/355, 358, 215, 368, 371; 370/516
See application file for complete search history.

(56) References Cited

U.S. PATENT DOCUMENTS 6,631,144 B1 * 10/2003 Johansen ..................... 370/516
7,684,532 B2 * 3/2010 Aung et al. ................... 375/355

OTHER PUBLICATIONS

"Virtex-4 RocketIO Multi-Gigabit Transceiver User Guide," UG076 (v4.0), Xilinx, pp. 1-339, Aug. 17, 2007 (see especially Figures 2-4, 2-5, 2-7, and 2-8).

* cited by examiner

*Primary Examiner* — Joseph Lauture
(74) *Attorney, Agent, or Firm* — Ropes & Gray LLP; Robert R. Jackson

(57) ABSTRACT

An integrated circuit (e.g., a programmable integrated circuit such as a programmable microcontroller, a programmable logic device, etc.) includes programmable circuitry and a channel of high-speed serial data signal interface (e.g., transceiver) circuitry. To facilitate enabling the integrated circuit to support any of many possible different high-speed serial communication protocols, the channel is hard-wired to include a parallel data bus of fixed width for exchanging parallel data with the programmable circuitry. Regardless of the protocol being implemented, the full width of this bus is always used. A portion of the programmable circuitry is programmed to convert data between the block width and a group width, which can be different from the block width and which is used for the data elsewhere in the integrated circuit.

16 Claims, 3 Drawing Sheets

HIGH-SPEED SERIAL INTERFACE CIRCUITRY FOR PROGRAMMABLE INTEGRATED CIRCUIT DEVICES

BACKGROUND OF THE INVENTION

This invention relates to integrated circuit devices, and more particularly to high-speed serial data signal interface or transceiver circuitry for use on programmable integrated circuit devices.

At present there is a great deal of interest in using high-speed serial data signalling for inter-device communication in many contexts. It is therefore desirable to give integrated circuit devices and especially programmable integrated circuit devices such as programmable microcontrollers, programmable logic devices ("PLDs"), etc., the ability to support such communication. However, various users of an integrated circuit of any of the above kinds may want to use high-speed serial communication in any of a large number of different forms. These forms may differ in such respects a data rate, byte or word length, etc. It can be difficult to provide high-speed serial interface or transceiver circuitry on an integrated circuit of any of the above kinds that can readily support so many different possible forms of high-speed serial communication.

High-speed serial communication on a device of the above kinds is typically supported by some circuitry that is hard-wired or at least partly hard-wired to perform some of the high-speed serial interface ("HSSI") tasks. At the very least, this hard-wired circuitry tends to be the part(s) that must handle the highest clock rates. On the transmitter side this is typically at least the final parallel-to-serial converter and serial data signal output driver circuitry. On the receiver side this is typically at least the serial data signal input buffer, the clock and data recovery ("CDR") circuitry, and the initial serial-to-parallel converter. Other functions associated with HSSI can be performed at lower clock rates in programmable circuitry of the device.

Interfacing between the hard-wired circuitry and the programmable circuitry of a device for the many different possible forms of high-speed serial communication that may be desired by various users can be a complex task. Although the hard-wired circuitry is dedicated to performing particular functions, some of its parameters may be selectable (e.g., programmable). Thus the hard-wired circuit does not always "look the same" to the programmable circuitry. Rather, that programmable circuitry must be extensively customized (i.e., programmed) to interface appropriately with each of the many different possible configurations and uses of the hard-wired circuitry. This is an undesirable burden on users of programmable integrated circuits for high-speed serial communication.

SUMMARY OF THE INVENTION

In accordance with certain possible aspects of the invention, an integrated circuit may include programmable circuitry and a channel of high-speed serial data signal receiver circuitry. This channel is hard-wired to always output in parallel a predetermined number of data bits that were received by the channel serially. A portion of the programmable circuitry may be programmed to receive the predetermined number of data bits from the channel, and to output bits thus received in groups of parallel bits, each of which groups can include a number of bits having any of a plurality of programmably selectable ratios to the predetermined number.

In accordance with other possible aspects of the invention, an integrated circuit may include programmable circuitry and a channel of high-speed serial data signal transmitter circuitry. This channel is hard-wired to always receive from the programmable circuitry a predetermined number of data bits in parallel for serial transmission by the channel. A portion of the programmable circuitry may be programmed to receive from other circuitry of the programmable circuitry groups of parallel data bits, and to output bits thus received in said predetermined number for application to the channel. Each of the above-mentioned groups can include a number of bits having any of a plurality of programmably selectable ratios to the predetermined number.

Further features of the invention, its nature and various advantages, will be more apparent from the accompanying drawings and the following detailed description.

DETAILED DESCRIPTION

Although the invention is equally applicable to other types of integrated circuits (e.g., various kinds of programmable integrated circuits such as programmable microcontrollers, etc.), the invention will be fully understood from the following illustrative discussion of its application to the type of integrated circuits known as programmable logic devices ("PLDs").

Figure 1:
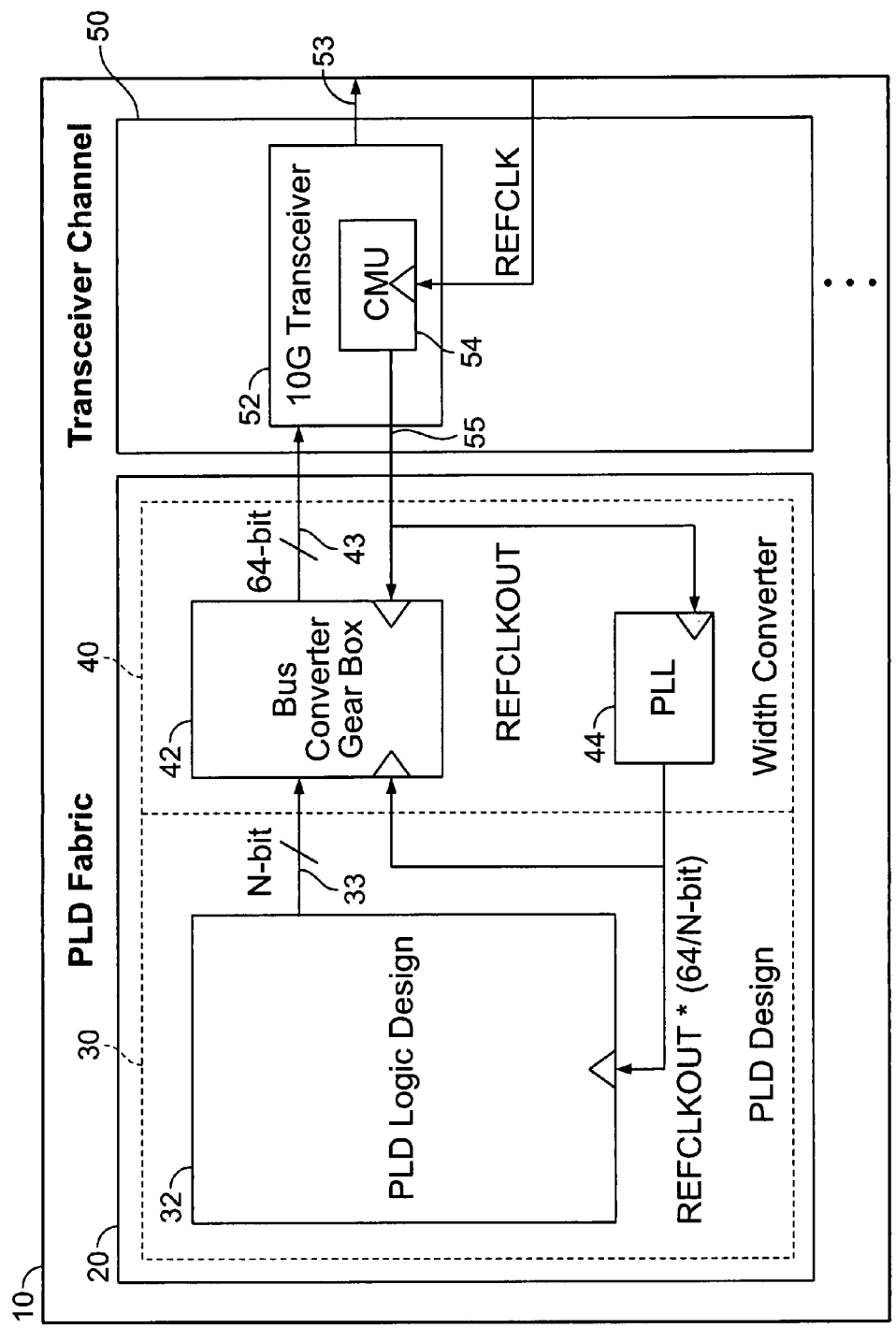
FIG. 1 is a simplified schematic block diagram of an illustrative embodiment of circuitry in accordance with the invention.
Figure 2:
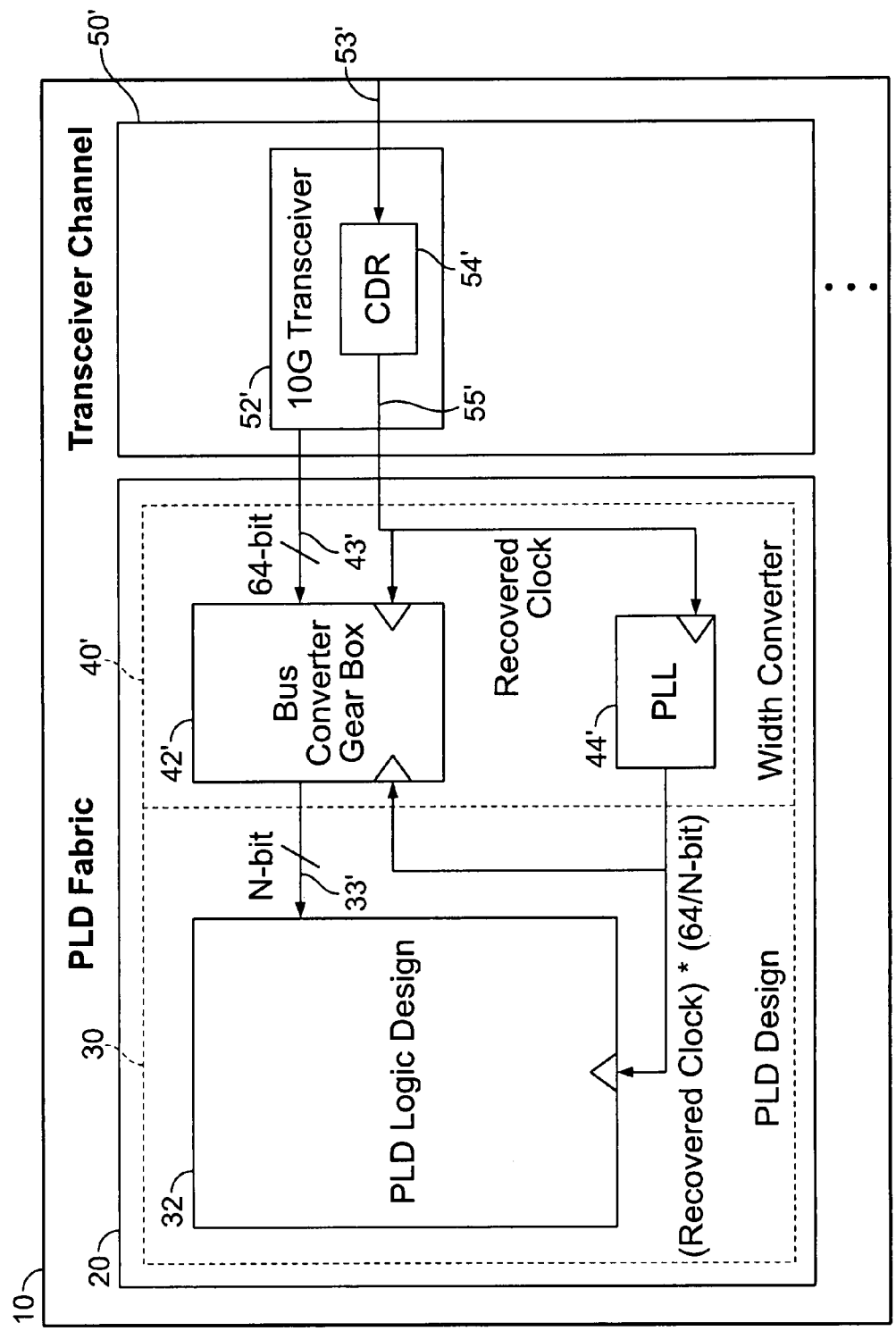
FIG. 2 is a simplified schematic block diagram of an illustrative embodiment of other circuitry in accordance with the invention.

An illustrative embodiment of high-speed serial data signal interface circuitry on a PLD in accordance with the invention is shown in FIG. 1. This FIG. shows primarily transmitter aspects of the invention. FIG. 2 (described later in this specification) shows primarily receiver aspects of the invention.

As shown in FIG. 1, PLD 10 includes primarily general-purpose programmable logic fabric 20 and transceiver channel 50. PLD fabric 20 typically includes an array of blocks of programmable logic. It may also include blocks of other kinds such as memory blocks, microprocessor blocks, digital signal processing ("DSP") blocks, etc. PLD fabric 20 also typically includes a network of programmable interconnection resources, which can be used to make connections to, from, and/or between the logic and other blocks in any of many different ways. PLD fabric 20 still further typically has various types of clock circuitry, which may include programmable networks for distributing various clock signals throughout the device, phase-locked loop ("PLL") circuitry (e.g., like PLL 44), etc.

FIG. 1 shows PLD fabric 20 partitioned into a PLD design portion 30 and a width converter portion 40. This is somewhat artificial and is done primarily for purposes of discussion herein, because the elements of width converter portion 40 may in fact be no different or not greatly different than other portions of PLD fabric 20. Thus, bus converter gear box 42 may be implemented by appropriately programming some of the general-purpose logic and general-purpose interconnect, etc., of PLD fabric 20 (just as PLD logic design 32 is implemented by appropriately programming other general-purpose logic and interconnect, etc., of the PLD fabric). Similarly, PLL 44 may be one of several general-purpose PLLs that are included in PLD fabric 20.

FIG. 1 shows transceiver channel 50 as a 10 gigabits per second transceiver 52. (Again, FIG. 1 deals mostly with the transmitter side of transceiver 52.) It will be understood, however, that 10 gigabits is only an example, and that the invention is equally applicable to transceivers designed for other speeds. In any event, 10 gigabits is only the nominal maximum speed of transceiver 52, and even this transceiver can operate at any of various speeds up to about 10 gigabits per second ("10 G").

Transceiver 52 is shown as including clock management (or multiplier) unit ("CMU") circuitry 54. CMU 54 receives a reference clock signal (e.g., from a source external to PLD 10) and produces clock signals that are usable for such purposes as (1) clocking the parallel-in and serial-out sides of parallel-to-serial converter circuitry in transceiver 52, (2) clocking the parallel-out side of bus converter gear box circuitry 42, and (3) providing a reference clock signal to PLL 44. To perform this function, CMU (which may itself include other PLL circuitry) typically multiplies the frequency of the reference clock signal it receives, and it may perform this multiplication by a selectable (e.g., programmably selectable) multiplication factor which different users can select to have different values.

It should be noted that whereas PLD fabric 20 is for the most part general-purpose circuitry that can be used to perform any of a vast array of different functions, the components of transceiver channel 50 tend to be hard-wired or at least partly hard-wired to perform particular functions. Some of the parameters of the functions that these dedicated components perform may be selectable and therefore variable (e.g., programmably selectable). But in each case such a hard-wired component is dedicated to performing a particular function or type of function. An example of such a dedicated component in 10 G transceiver 52 would be parallel-to-serial converter circuitry.

In accordance with the present invention, the interface between PLD fabric 20 and transceiver channel 50 is standardized or at least relatively standardized, regardless of the form of high-speed serial communication for which the user wants to use transceiver channel 50. FIG. 1 shows an example of such a standardized interface on the transmitter side. In particular, this interface includes a 64-bit parallel data bus 43 from gear box 42 to transceiver 52, and a reference clock output signal 55 from CMU 54 to gear box 42 and PLL 44. (64-bit bus 43 is only an example, and any other parallel bus width could be used instead if desired.)

As part of the above-mentioned standard interface, CMU 54 is arranged to produce a REFCLKOUT signal 55 having a frequency that is always 1/64 the desired output serial bit rate on serial data output lead 53. In other words, in addition to other clock signals that CMU 54 may produce based on its REFCLK input signal, CMU 54 also produces (based on REFCLK) at least (1) a clock signal for clocking the serial data out on lead 53 at the desired serial bit rate, and (2) a REFCLKOUT signal on lead 55, which REFCLKOUT signal has a frequency that is 1/64 the serial data output signal clock frequency.

Also as part of the above-mentioned standard interface, transceiver 52 always receives 64 bits of parallel data on bus 43. (These 64-bit data blocks are clocked out of gear box 42 and into transceiver 52 by the REFCLKOUT signal.) Transceiver 52 thus always operates to convert each successive block of 64 data bits on bus 43 to the next 64 serial bits in the serial data output stream on lead 53 (which may actually be two leads in the case of differential output signalling). Transceiver 52 is therefore preferably hard-wired to operate in this way (e.g., to include a 64-bit bus at the transceiver end of bus 43).

Inside the width converter 40 portion of PLD fabric 20, gear box 42 can receive data in parallel groups of any width via connections 33 (typically part of the general-purpose programmable interconnection resources of PLD fabric 20). The letter N is used for the width (number of parallel bits or leads) of link 33. Based on the REFCLKOUT signal and the value of N, PLL 44 produces a clock signal (REFCLKOUT* (64/N)) that is used for clocking successive N-bit data groups out of PLD logic design 32 and into gear box 42. Unlike the width of bus 43, which is hard-wired and therefore always the same, the value of N is preferably programmably selectable, so that different users of PLD 20 can employ different values of N.

From the foregoing it will be seen that although the group and block rates of data going into and out of gear box 42 may be different (i.e., if N is not equal to 64), the bit rate of that data going into and out of gear box 42 is the same (and also the same as the serial data output bit rate on lead 53). Assuming that the group and block rates in and out of gear box 42 are different, what gear box 42 does is regroup the bits received in N-bit groups to 64-bit blocks for passage across the standard interface 43 to transceiver 52. General-purpose circuitry of PLD fabric 20 can be readily programmed to perform this regrouping from any of a wide range of possible values of N to 64 (the interface standard). Similarly, PLL 44, which typically has selectable frequency multiplication and/or division coefficients (e.g., that are programmable) can also be readily configured to produce any of a large number of frequency ratios between REFCLKOUT and REFCLKOUT* (64/N).

As just one illustrative example of the above, if transceiver 52 is operating at 10 Gbps, then the parallel interface 43 64-bit block frequency is 156.25 MHz. If N is 80, then the 156.25 MHz REFCLKOUT signal will be operated on by PLL 44 with a multiplication factor of 0.8. The result is that the clock signal fed to circuitry 32 and the input side of circuitry 42 (i.e., REFCLKOUT*(64/N)) has a frequency of 125 MHz.

An illustrative embodiment of high-speed serial data signal receiver circuitry in accordance with the invention is shown in FIG. 2. This circuitry employs principles similar to those described above in connection with the transmitter circuitry of FIG. 1. To the greatest extent possible, the same reference numbers are used in FIGS. 1 and 2 for the same or at least conceptually similar elements. Some of these reference numbers are primed in FIG. 2 to indicate that these elements are in fact different from the similarly numbered FIG. 1 elements (although there are underlying conceptual similarities).

As shown in FIG. 2, high-speed serial data signal receiver channel circuitry 52' receives a serial data signal via lead(s) 53'. This signal is processed by clock and data recovery ("CDR") circuitry 54' to recover from the received data signal a clock signal (with which data in the received signal is synchronized) and a retimed data signal. Circuitry 52' then converts the retimed data signal to parallel form to completely fill the full width of hard-wired bus 43'. Parallel data bus 43' is shown as having 64 parallel data leads, but it will be understood that in other embodiments of the invention bus 43' can have some other plural number of parallel data leads. Whatever the width of bus 43', channel 50' is hard-wired to always include a bus of that width and to always use the full width of that bus for outputting received data to array 20.

The recovered clock on lead 55' has preferably been converted by circuitry 52' from a serial bit rate clock to a clock having frequency suitable for clocking successive blocks of parallel data on bus 43' out of channel 50' and into array 20. For example, if bus 43' is 64 bits wide (as shown in the FIG. 2 example), the frequency of recovered clock signal 55' is typically the serial bit rate divided by 64. This signal 55' is used both to clock successive parallel data blocks out of circuitry 52' and to clock those blocks into bus converter gear box circuitry 42'. Signal 55' is also applied to PLL circuitry 44' as a reference clock signal.

As in the case of FIG. 1, it may be desirable for circuitry 32 of array 20 beyond width converter 40' to work with groups of parallel data bits that are different in width than bus 43'. Bus converter gear box 42' takes in successive blocks of parallel data bits from bus 43' and regroups those bits into groups of the possibly different size that is desirable for logic design 32. N is the variable parameter that is used to indicate the size of the groups that it is desired for circuitry 42' to output. PLL 44' is programmable to use recovered clock signal 55' to produce a further clock signal ((Recovered Clock)*(64/N)) having a frequency suitable for use in clocking groups of N parallel data bits out of circuitry 42' and into PLD logic design 32. Analogous to the example discussed above in connection with FIG. 1, if the FIG. 2 circuitry is receiving serial data 53' at 10 Gbps, then recovered clock signal 55' has a frequency of 156.25 MHz (10 G divided by 64). If N is 80, then PLL 44' is programmed to output a signal ((Recovered Clock)*(64/N)) having a frequency of 125 MHz.

From the foregoing it will be appreciated that, whether on the transmitter side or the receiver side, transceiver channel 50 or 50' is hard-wired to always have a parallel data bus 43 or 43' of a predetermined fixed width (e.g., a width of 64 parallel bits in the illustrative embodiments shown in FIGS. 1 and 2). To further facilitate the interface between channel 50 or 50' and array 20, the transceiver channel is also hard-wired consistent with bus 43 or 43' being always completely filled with data (e.g., successive blocks of 64 bits in the illustrative embodiments shown in FIGS. 1 and 2). Further facilitating the interface between channel 50 or 50' and array 20, channel 50 or 50' is hard-wired to output a reference clock signal to array 20 which has the same relationship to the serial data bit rate that the parallel bus 43 or 43' width has to 1. Channel 50 or 50' therefore always "looks the same" to array 20, regardless of the high-speed serial data signal communication protocol or scheme the channel is implementing. A portion 42 or 42' of general-purpose logic array 20 is programmed to provide any data regrouping that is necessary to interface between the width of parallel bus 43 or 43' and other circuitry of array 20 (e.g., the programmably selectable width of the parallel bus 33 or 33' (not hard-wired) between circuitry 42 or 42' and other array circuitry 32). A programmably controllable PLL 44 or 44' supports this interfacing function of circuitry 42 or 42' by providing the second clock signal (with appropriate frequency) required by circuitry 42 or 42' on the circuitry 32 side of circuitry 42 or 42'.

Figure 3:
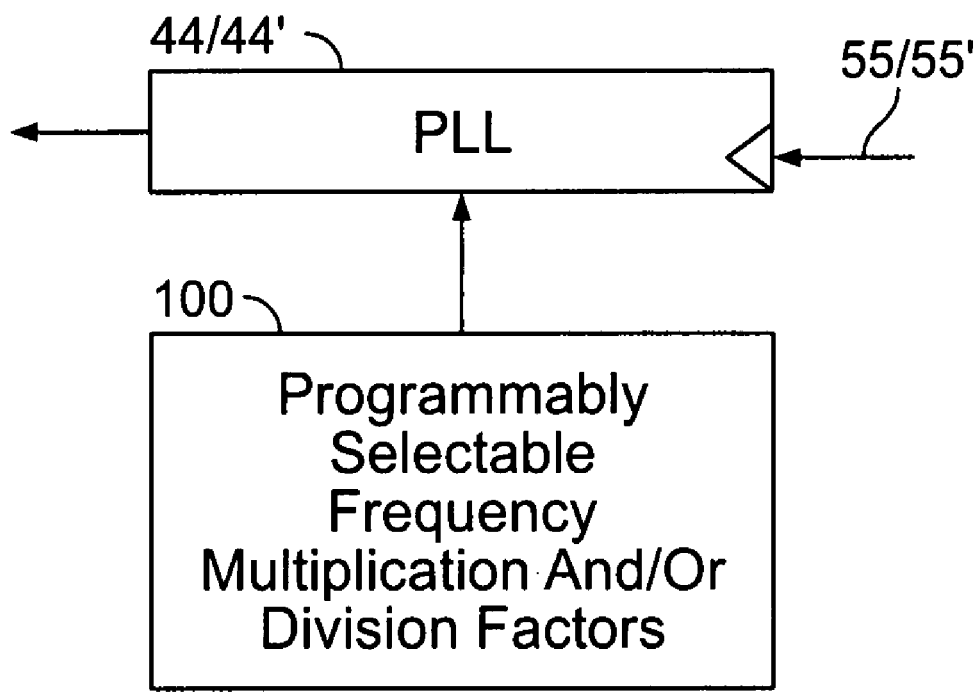
FIG. 3 is a simplified block diagram showing an illustrative embodiment of a portion of FIG. 1 or FIG. 2 in more detail in accordance with the invention.

FIG. 3 is provided to illustrate the point that PLL 44 or 44' may be programmable with respect to frequency multiplication and/or division factors that it uses in its operations. These factors may be programmable into a coefficient memory 100 of PLD 10.

The various aspects of "programming" or the like that are mentioned above can be accomplished in various ways. For example, a device in accordance with the invention can be field-programmable, mask-programmable, or programmable in any other way. Moreover, various technologies can be used to make a device programmable. Examples include programmable or configurable memory cells, fuses, anti-fuses, metal optional links, etc. Depending on the technology used, the devices can be one-time-only programmable, or they can be reprogrammable.

By way of recapitulation and extension of the above, some of the benefits and advantages of the invention are summarized in the following. One benefit/advantage of the invention is that it can simplify transceiver architectures. The invention can reduce the complexity of the additional circuitry that allows the parameterization of the clocking and transceiver-to-PLD-fabric interface. This allows the transceiver architecture to be designed with a defined, fixed transceiver-to-PLD-fabric interface and internal clocking domains.

Another possible benefit/advantage of the invention is that it can reduce transceiver verification time. By eliminating or at least reducing the complexity of the additional circuitry that allows parameterization of the clocking and the transceiver-to-PLD-fabric interface, the invention reduces the circuitry and transceiver permutations that need to be verified and characterized.

Still another possible benefit/advantage of the invention is that it can decrease transceiver power consumption. The transceiver architectures of this invention have defined PLD interface and internal clocking domains. This reduces the need for additional circuitry to configure and support various "flavors" of clocking and PLD interface sizes. This in turn reduces the circuit size and power consumption.

Yet another possible benefit/advantage of the invention is that it has relatively low implementation overhead. The invention utilizes the already-existing PLD architecture and resources (e.g., programmable general-purpose logic elements, routing resources, and PLLs), thereby yielding a low-overhead implementation.

Still another possible benefit/advantage of the invention is that it can allow custom bus widths N. The invention offers the ability to support a wide range of custom bus widths. Of course this aspect has the limitation that it is restricted to what clock ratios can be generated by the PLL (e.g., 44 or 44').

It will be understood that the foregoing is only illustrative of the principles of the invention, and that various modifications can be made by those skilled in the art without departing from the scope and spirit of the invention. For example, the clock speeds and bus widths mentioned specifically above are only examples, and parameters such as these can have other values in other embodiments of the invention. Although FIGS. 1 and 2 tend to show the transmitter and receiver circuitry separately, it will be understood that both types of circuitry can be (and typically are) combined in the same device. And again, although the invention has been illustratively described for the most part herein in the context of PLDs, the invention is equally applicable to any type of integrated circuit, especially integrated circuits that are programmable.

The invention claimed is:

1. An integrated circuit comprising:
    programmable circuitry; and
    a channel of high-speed serial data signal receiver circuitry that is hard-wired to always output in parallel a predetermined number of data bits that were received by the channel serially;
    wherein a portion of the programmable circuitry is programmed to receive the predetermined number of data bits from the channel and to output bits thus received in groups of parallel bits, each of which groups can include a number of bits having any of a plurality of programmably selectable ratios to the predetermined number;
    wherein the channel receives the data bits serially at a serial bit rate and produces a first reference clock signal having a first frequency that is the serial bit rate divided by the predetermined number; wherein said portion of the programmable circuitry is responsive to the first reference clock signal to clock the predetermined number of data bits received from the channel into said portion; and wherein the programmable circuitry further comprises:

phase-locked loop circuitry that receives the first reference clock signal and that is programmable to produce a second clock signal having a second frequency that has any one of the programmably selectable ratios to the first frequency.

2. The integrated circuit defined in claim 1 wherein said portion of the programmable circuitry is responsive to the second clock signal to clock the groups of data bits out of said portion.

3. The integrated circuit defined in claim 2 wherein the groups output by said portion of the programmable circuitry are applied to other circuitry of the integrated circuit.

4. The integrated circuit defined in claim 1 wherein the integrated circuit comprises a programmable integrated circuit.

5. An integrated circuit comprising:
programmable circuitry; and
a channel of high-speed serial data signal transmitter circuitry that is hard-wired to always receive from the programmable circuitry a predetermined number of data bits in parallel for transmitting by the channel serially;
wherein a portion of the programmable circuitry is programmed to received from other circuitry of the integrated circuit groups of parallel data bits and to output bits thus received in said predetermined number for application to the channel, each of which groups can include a number of bits having any of a plurality of programmably selectable ratios to the predetermined number; wherein the channel transmits the data bits serially at a serial bit rate and produces a first reference clock signal having a first frequency that is the serial bit rate divided by the predetermined number; wherein said portion of the programmable circuitry is responsive to the first reference clock signal to clock the predetermined number of data bits out of said portion to the channel; and wherein the programmable circuitry further comprises:
phase-locked loop circuitry that receives the first reference clock signal and that is programmable to produce a second clock signal having a second frequency that has any one of the programmably selectable ratios to the first frequency.

6. The integrated circuit defined in claim 5 wherein said portion of the programmable circuitry is responsive to the second clock signal to clock the groups of data bits into said portion.

7. The integrated circuit defined in claim 5 wherein the channel additionally receives a further reference clock signal having a frequency that bears a predetermined relationship to the serial bit rate.

8. The integrated circuit defined in claim 5 wherein the integrated circuit comprises a programmable integrated circuit.

9. An integrated circuit comprising:
programmable circuitry; and
a channel of high-speed serial data signal receiver circuitry that is hard-wired to include a parallel data output bus for always outputting to the programmable circuitry a predetermined number of data bits in parallel, said bits having been received by the channel serially;
wherein a portion of the programmable circuitry is programmed to receive successive blocks of the predetermined number of parallel bits from the bus and to output bits thus received in successive groups of parallel bits, each of which groups can include a number of bits having any of a plurality of programmably selectable ratios to the predetermined number; wherein the channel receives the data bits serially at a serial bit rate and produces a first reference clock signal having a first frequency that is the serial bit rate divided by the predetermined number; wherein said portion of the programmable circuitry is responsive to the first reference clock signal to clock successive blocks received from the bus into said portion; and wherein the programmable circuitry further comprises:
phase-locked loop circuitry that receives the first reference clock signal and that is programmable to produce a second clock signal having a second frequency that has any one of the programmably selectable ratios to the first frequency.

10. The integrated circuit defined in claim 9 wherein said portion of the programmable circuitry is responsive to the second clock signal to clock successive groups out of said portion.

11. The integrated circuit defined in claim 10 wherein the groups output by said portion of the programmable circuitry are applied to other circuitry of the integrated circuit.

12. The integrated circuit defined in claim 9 wherein the integrated circuit comprises a programmable integrated circuit.

13. An integrated circuit comprising:
programmable circuitry; and
a channel of high-speed serial transmitter circuitry that is hard-wired to include a parallel data input bus for always receiving from the programmable circuitry a predetermined number of data bits in parallel, said bits being transmitted by the channel serially;
wherein a portion of the programmable circuitry is programmed to receive successive groups of parallel bits and to output bits thus received to the bus in successive blocks of the predetermined number of parallel bits, each of which groups can include a number of bits having any of a plurality of programmably selectable ratios to the predetermined number; wherein the channel transmits the data bits serially at a serial bit rate and produces a first reference clock signal having a first frequency that is the serial bit rate divided by the predetermined number; wherein said portion of the programmable circuitry is responsive to the first reference clock signal to clock successive blocks out of said portion onto the bus; and wherein the programmable circuitry further comprises:
phase-locked loop circuitry that receives the first reference clock signal and that is programmable to produce a second clock signal having a second frequency that has any one of the programmably selectable ratios to the first frequency.

14. The integrated circuit defined in claim 13 wherein said portion of the programmable circuitry is responsive to the second clock signal to clock successive groups into said portion.

15. The integrated circuit defined in claim 13 wherein the channel additionally receives a further reference clock signal having a frequency that bears a predetermined relationship to the serial bit rate.

16. The integrated circuit defined in claim 13 wherein the integrated circuit comprises a programmable integrated circuit.

* * * * *